(12) United States Patent
Park et al.

(10) Patent No.: US 8,039,567 B2
(45) Date of Patent: Oct. 18, 2011

(54) ALTERNATING COPOLYMERS OF PHENYLENE VINYLENE AND BIARYLENE VINYLENE, PREPARATION METHOD THEREOF, AND ORGANIC THIN FILM TRANSISTOR COMPRISING THE SAME

(75) Inventors: Jong Il Park, Seongnam-si (KR); Kook Min Han, Suwon-si (KR); Sang Yoon Lee, Seoul (KR); Eun Jeong Jeong, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/926,951

(22) Filed: Dec. 20, 2010

(65) Prior Publication Data
US 2011/0089409 A1    Apr. 21, 2011

Related U.S. Application Data

(62) Division of application No. 12/081,680, filed on Apr. 18, 2008, now abandoned.

(30) Foreign Application Priority Data

Nov. 8, 2007 (KR) .......................... 10-2007-0113754

(51) Int. Cl.
*C08F 128/06* (2006.01)
(52) U.S. Cl. ....................................... 526/256; 526/257
(58) Field of Classification Search ................... 526/256, 526/257
See application file for complete search history.

(56) References Cited

U.S. PATENT DOCUMENTS

| | | | |
|---|---|---|---|
| 5,625,199 | A | 4/1997 | Baumbach et al. |
| 5,946,551 | A | 8/1999 | Dimitrakopoulos et al. |
| 6,107,117 | A | 8/2000 | Bao et al. |
| 6,232,157 | B1 | 5/2001 | Dodabalapur et al. |
| 6,452,207 | B1 | 9/2002 | Bao |

FOREIGN PATENT DOCUMENTS

WO    WO 00/79617    6/2000

*Primary Examiner* — Bernard Lipman
(74) *Attorney, Agent, or Firm* — Harness, Dickey & Pierce, P.L.C.

(57) ABSTRACT

Disclosed herein are an alternating copolymer of phenylene vinylene and biarylene vinylene, a preparation method thereof, and an organic thin film transistor including the same. The organic thin film transistor maintains low off-state leakage current and realizes a high on/off current ratio and high charge mobility because the organic active layer thereof is formed of an alternating copolymer of phenylene vinylene and biarylene vinylene.

5 Claims, 3 Drawing Sheets

ALTERNATING COPOLYMERS OF PHENYLENE VINYLENE AND BIARYLENE VINYLENE, PREPARATION METHOD THEREOF, AND ORGANIC THIN FILM TRANSISTOR COMPRISING THE SAME

PRIORITY STATEMENT

This application is a Divisional of U.S. application Ser. No. 12/081,680 filed Apr. 18, 2008, now abandoned, which claims priority under U.S.C. §119 to Korean Patent Application No. 10-2007-0113754, filed on Nov. 8, 2007, in the Korean Intellectual Property Office (KIPO), the entire contents of which are incorporated herein in their entirety by reference.

BACKGROUND

1. Field of the Invention

This disclosure is directed to an alternating copolymer of phenylene vinylene and biarylene vinylene, a preparation method thereof, and an organic thin film transistor comprising the same, and, more particularly, to an alternating copolymer of phenylene vinylene and biarylene vinylene, which comprises phenylene vinylene and biarylene vinylene alternating in the polymer backbone, and thus, when applied to the organic active layer of an organic thin film transistor, a high on/off current ratio and high charge mobility can be imparted while low off-state leakage current is maintained, and to a preparation method thereof and an organic thin film transistor comprising the same.

2. Description of the Related Art

Generally, an organic thin film transistor (OTFT) comprises a substrate, a gate electrode, an insulating layer, source/drain electrodes, and a channel layer, and is classified formed on source/drain electrodes, and a top contact (TC) type, in which metal electrodes are formed on a channel layer through mask deposition.

The channel layer of the TFT is typically formed of an inorganic semiconductor material, such as silicon (Si). Recently, however, in order to realize large, inexpensive, and flexible displays, the demand to use an organic semiconductor material, in place of expensive inorganic material, requiring a high-temperature vacuum process, is increasing.

Thus, thorough research into organic semiconductor materials useful as the channel layer of OTFTs and transistor properties using the same is being conducted. Examples of low-molecular-weight or oligomeric organic semiconductor materials include merocyanine, phthalocyanine, perylene, pentacene, C60, or thiophene oligomer. Lucent Technologies and 3M reported the use of pentacene monocrystals to realize OTFTs having high charge mobility of 3.2~5.0 $cm^2/Vs$ (Mat. Res. Soc. Symp. Proc. 2003, Vol. 771, L6.5.1~L6.5.11).

In addition, OTFTs using a thiophene polymer as the polymer material have been reported. Although these OTFTs have properties inferior to those of OTFTs using low-molecular-weight material, they are advantageous with respect to the processability thereof because a large area may be realized at a low expense through a solution process, for example, a printing process. Further, the organic semiconductor polymer material has lower charge mobility than low-molecular-weight material, including pentacene, but is preferable thereto because it eliminates the need for a high operating frequency and enables the inexpensive fabrication of TFTs.

With the goal of commercializing the OTFTs, off-state leakage current, in addition to charge mobility, must be minimized. That is, a high on/off current ratio should be satisfied. To this end, various attempts to improve such properties are being made.

SUMMARY

Disclosed herein is a novel alternating copolymer of phenylene vinylene and biarylene vinylene, which has high solubility in an organic solvent and high processability and exhibits partial coplanarity to thus realize amorphous properties and superior π-stacking properties when formed into a film, and a method of preparing the same.

Also disclosed herein is an OTFT, the organic active layer of which is formed of an alternating copolymer of phenylene vinylene and biarylene vinylene prepared by adding an arylene group to an arylene derivative and having a decreased band gap, thus realizing high mobility of charges and holes.

Also disclosed herein is an electronic device, comprising the alternating copolymer of phenylene vinylene and biarylene vinylene.

In one embodiment, a novel alternating copolymer of phenylene vinylene and biarylene vinylene is provided, which is adapted for use in the organic active layer of an OTFT to improve device properties. Such an alternating copolymer of phenylene vinylene and biarylene vinylene may be represented by Formula 1 below:

Formula 1

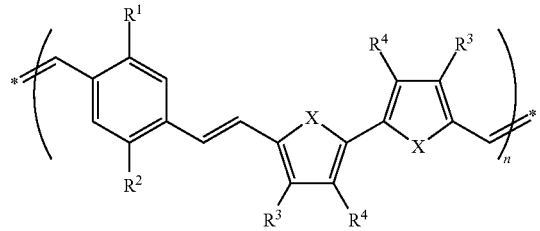

wherein $R^1$, $R^2$, $R^3$, and $R^4$ are each independently selected from the group consisting of hydrogen, a hydroxyl group, a $C_{1\sim20}$ linear, branched or cyclic alkyl group, a $C_{1\sim20}$ alkoxyalkyl group, and a $C_{1\sim16}$ linear, branched or cyclic alkoxy group, X is selected from the group consisting of S, O, NH, N-methyl, and Se, and n is an integer from 4 to 200.

The alternating copolymer of phenylene vinylene and biarylene vinylene is a novel p-type polymer organic semiconductor, having a structure in which phenylene vinylene and biarylene vinylene having an aryl group acting as a hole donor alternate in the polymer backbone, and exhibiting conductive polymer properties.

In another embodiment, a method of preparing the alternating copolymer of phenylene vinylene and biarylene vinylene is provided. The method may include copolymerizing a monomer represented by Formula 4 below with a monomer represented by Formula 5 below:

Formula 4

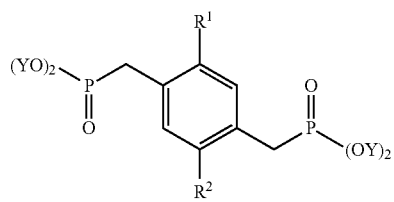

wherein $R^1$ and $R^2$ are each independently selected from the group consisting of hydrogen, a hydroxyl group, a $C_{1\sim20}$ linear, branched or cyclic alkyl group, a $C_{1\sim20}$ alkoxyalkyl group, and a $C_{1\sim16}$ linear, branched or cyclic alkoxy group, and Y is a $C_{1\sim4}$ alkyl group; and

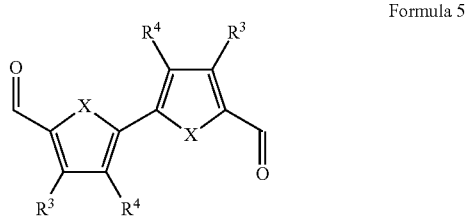

Formula 5 wherein $R^3$ and $R^4$ are each independently selected from the group consisting of hydrogen, a hydroxyl group, a $C_{1\sim20}$ linear, branched or cyclic alkyl group, a $C_{1\sim20}$ alkoxyalkyl group, and a $C_{1\sim16}$ linear, branched or cyclic alkoxy group, and X is selected from the group consisting of S, O, NH, N-methyl, and Se.

In a further embodiment, an OTFT is provided, which comprises a substrate, a gate electrode, a gate insulating layer, an organic active layer, and source/drain electrodes, the organic active layer being formed of the alternating copolymer of phenylene vinylene and biarylene vinylene. Because the organic active layer of the OTFT is formed of the alternating copolymer of phenylene vinylene and biarylene vinylene, low off-state leakage current may be maintained and a high on/off current ratio may be attained. Further, the arylene group is added to the arylene derivative, and thus a band gap may be decreased, and charges or holes may be efficiently transported, resulting in high charge mobility.

The alternating copolymer of phenylene vinylene and biarylene vinylene may also be applied to various electronic devices, examples of the electronic device including, but not being limited to, an organic light emitting device (OLED), an organic photovoltaic device, or a sensor.

BRIEF DESCRIPTION OF THE DRAWINGS

Example embodiments will be more clearly understood from the following detailed description taken in conjunction with the accompanying drawings, in which.

DETAILED DESCRIPTION OF EXAMPLE EMBODIMENTS

Figure 1:
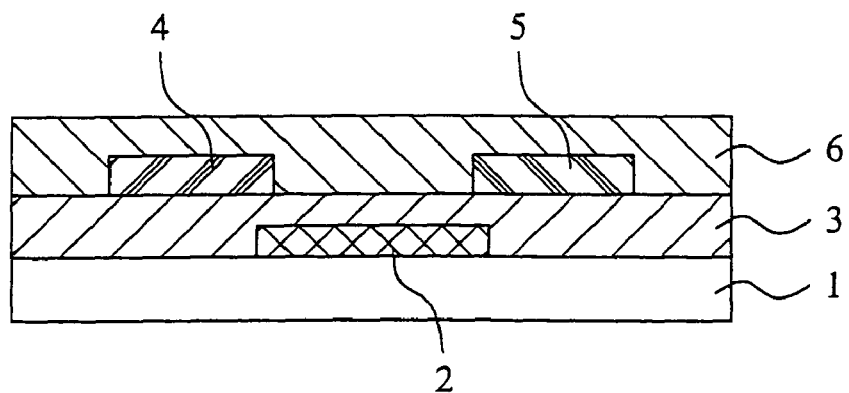
FIG. 1 is an exemplary schematic cross-sectional view illustrating an OTFT.

Hereinafter, example embodiments will be described in detail with reference to the attached drawings. Example embodiments may, however, be embodied in many different forms and should not be construed as being limited to the embodiments set force herein. Rather, these embodiments are provided so that this disclosure will be thorough and complete, and will fully convey the scope of example embodiments to those skilled in the art.

In accordance with one embodiment, an alternating copolymer of phenylene vinylene and biarylene vinylene may be represented by Formula 1 below:

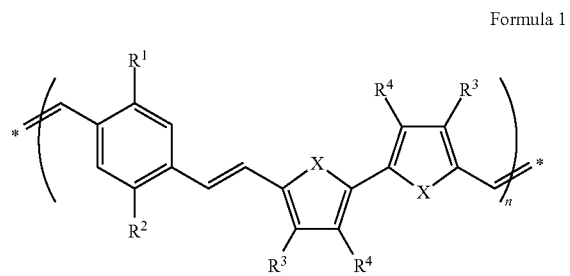

Formula 1 wherein $R^1$, $R^2$, $R^3$, and $R^4$ are each independently selected from the group consisting of hydrogen, a hydroxyl group, a $C_{1\sim20}$ linear, branched or cyclic alkyl group, a $C_{1\sim20}$ alkoxyalkyl group, and a $C_{1\sim16}$ linear, branched or cyclic alkoxy group, X is selected from the group consisting of S, O, NH, N-methyl, and Se, and n is an integer from 4 to 200.

In addition, examples of the alternating copolymer of phenylene vinylene and biarylene vinylene include, but are not limited to, a compound selected from the group represented by Formula 2 below:

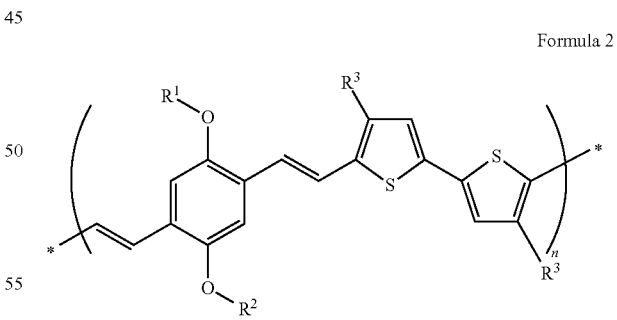

Formula 2 wherein $R^1$ and $R^2$ are each independently selected from the group consisting of a hexyl group, a heptyl group, and an octyl group, $R^3$ is selected from the group consisting of a butyl group, a hexyl group, and an octyl group, and n is an integer from 4 to 200.

In addition, examples of the alternating copolymer of phenylene vinylene and biarylene vinylene include, but are not limited to, a compound selected from the group represented by Formula 3 below.

Formula 3

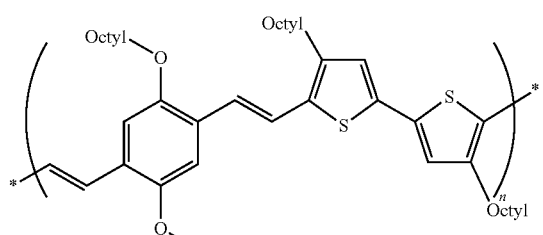
PPVBTV-1

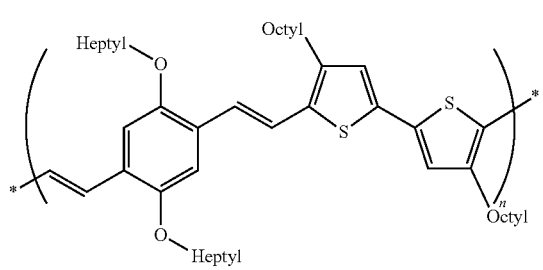
PPVBTV-2

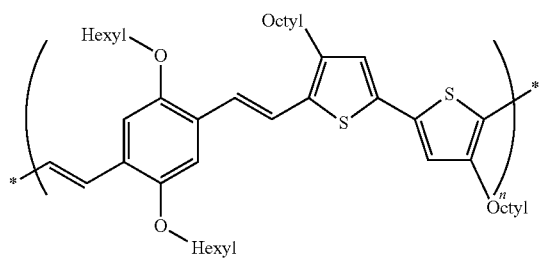
PPVBTV-3

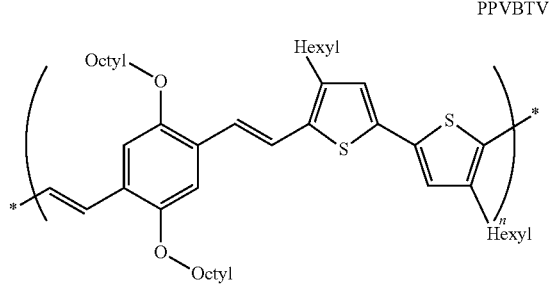
PPVBTV-4

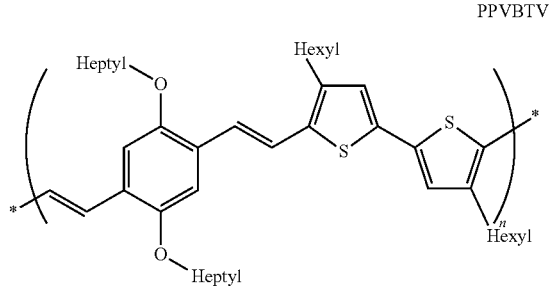
PPVBTV-5

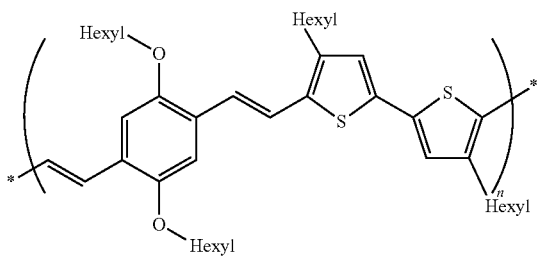
PPVBTV-6

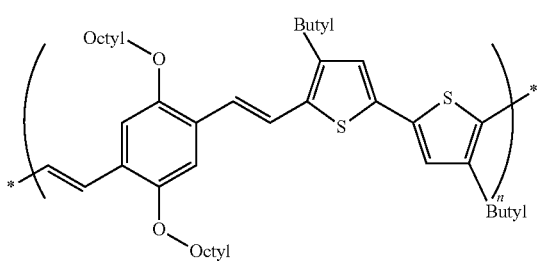
PPVBTV-7

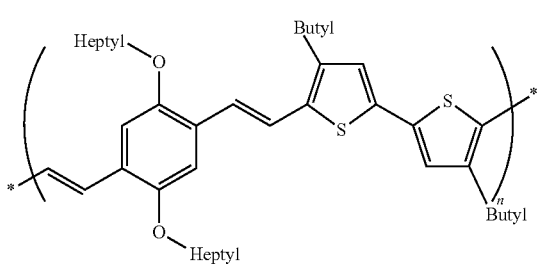
PPVBTV-8

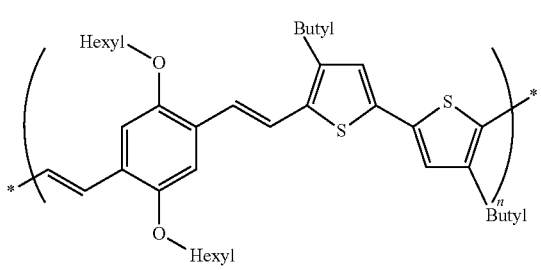
PPVBTV-9

The alternating copolymer of phenylene vinylene and biarylene vinylene has high solubility in an organic solvent and high processability, and exhibits partial coplanarity.

Further, when the compound, in which phenylene vinylene and biarylene vinylene alternate in the polymer backbone, is formed into a film, amorphous properties and superior π-stacking properties may be manifested.

In accordance with another embodiment, a method of preparing the alternating copolymer of phenylene vinylene and biarylene vinylene is provided. The method of preparing the alternating copolymer of phenylene vinylene and biarylene vinylene includes copolymerizing a monomer represented by Formula 4 below with a monomer represented by Formula 5 below:

Formula 4

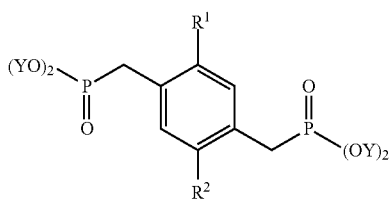

wherein $R^1$ and $R^2$ are each independently selected from the group consisting of hydrogen, a hydroxyl group, a $C_{1\sim20}$ linear, branched or cyclic alkyl group, a $C_{1\sim20}$ alkoxyalkyl group, and a $C_{1\sim16}$ linear, branched or cyclic alkoxy group, and Y is a $C_{1\sim4}$ alkyl group; and Formula 5

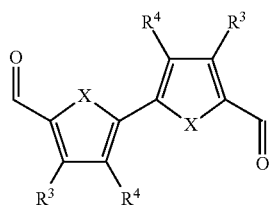

wherein $R^3$ and $R^4$ are each independently selected from the group consisting of hydrogen, a hydroxyl group, a $C_{1\sim20}$ linear, branched or cyclic alkyl group, a $C_{1\sim20}$ alkoxyalkyl group, and a $C_{1\sim16}$ linear, branched or cyclic alkoxy group, and X is selected from the group consisting of S, O, NH, N-methyl, and Se.

Examples of the monomer represented by Formula 5, include, but are not limited to, a monomer selected from the group represented by Formula 6 below:

Formula 6

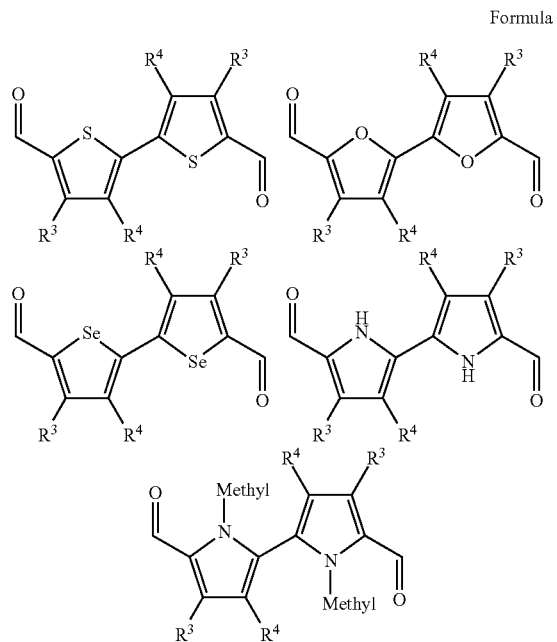

wherein $R^3$ and $R^4$ are each independently selected from the group consisting of hydrogen, a hydroxyl group, a $C_{1\sim20}$ linear, branched or cyclic alkyl group, a $C_{1\sim20}$ alkoxyalkyl group, and a $C_{1\sim16}$ linear, branched or cyclic alkoxy group.

Further, examples of the monomer represented by Formula 5, include, but are not limited to, a monomer selected from the group represented by Formula 7 below.

Formula 7

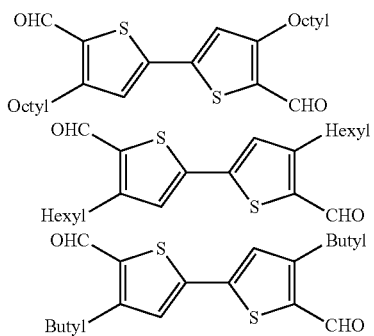

According to the example embodiments, the alternating copolymer of phenylene vinylene and biarylene vinylene may be polymerized through a Horner-Emmons reaction. Through such a reaction, dialkyl phosphoric acid is removed from the phenylene derivative, and a double bond is formed between the phenylene derivative and the biarylene derivative, thus obtaining an alternating copolymer of phenylene vinylene and biarylene vinylene. In the above reaction, sodium methoxide or potassium butoxide may be used as a reaction accelerator, and examples of the polymerization solvent include dimethylformaldehyde (DMF), tetrahydrofuran (THF), or N-methylpyrrolidinone (NMP).

The polymerization reaction of the alternating copolymer of phenylene vinylene and biarylene vinylene is shown by way of example in Scheme 1 below.

Scheme 1

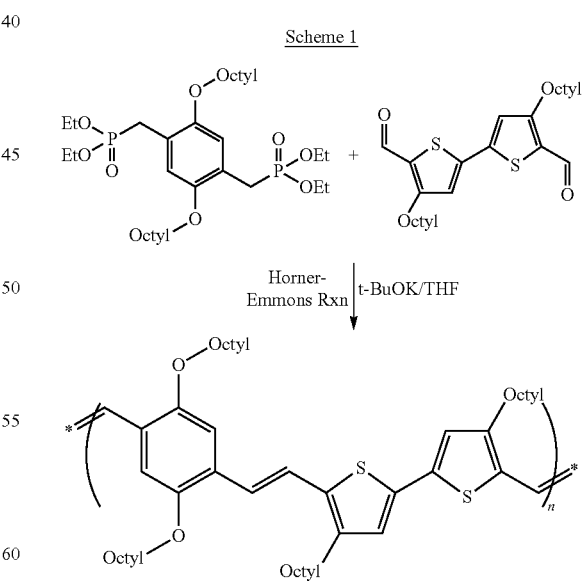

Here, n is an integer from 4 to 200.

The alternating copolymer (PPVBTV-1) of phenylene vinylene and bithiophene vinylene obtained through Scheme 1 has a number average molecular weight ranging from about 10,000 to about 100,000.

According to the example embodiments, the alternating copolymer of phenylene vinylene and biarylene vinylene preferably has a number average molecular weight of 10,000 or more. When the number average molecular weight thereof is less than 10,000, it is difficult to form a thin film, and poor current transfer properties result.

In accordance with a further embodiment, an OTFT, comprising a substrate, a gate electrode, a gate insulating layer, an organic active layer, and source/drain electrodes, is provided, in which the organic active layer is formed of the alternating copolymer of phenylene vinylene and biarylene vinylene. In this way, when the organic active layer of the OTFT is formed of the alternating copolymer of phenylene vinylene and biarylene vinylene, low off-state leakage current is maintained, and simultaneously, a high on/off current ratio is realized. Further, an arylene group is added to an arylene derivative, thus decreasing a band gap and efficiently transporting electrons or holes, resulting in high charge mobility.

Specifically, the alternating copolymer of phenylene vinylene and biarylene vinylene according to the example embodiments may be used as a novel organic semiconductor material to manufacture the active layer of the OTFT. Examples of the process of forming the organic active layer include, but are not limited to, screen printing, printing, spin coating, dipping, or ink jetting.

FIG. 1 is an exemplary schematic cross-sectional view illustrating the OTFT.

With reference to FIG. 1, the OTFT is manufactured to have a structure, including a substrate 1, a gate electrode 2, a gate insulating layer 3, a source electrode 4, a drain electrode 5, and an organic active layer 6, but the example embodiments are not limited thereto.

The gate insulating layer 3 of the OTFT is formed of a typical insulator having a high dielectric constant, and specific examples of the insulator include, but are not limited to, a ferroelectric insulator selected from the group consisting of $Ba_{0.33}Sr_{0.66}TiO_3$ (BST), $Al_2O_3$, $Ta_2O_5$, $La_2O_5$, $Y_2O_3$ and $TiO_2$, an inorganic insulator selected from the group consisting of $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$ and AlON, or an organic insulator including polyimide, BCB (benzocyclobutene), parylene, polyacrylate, polyvinylalcohol and polyvinylphenol.

The gate electrode 2, the source electrode 4, and the drain electrode 5 of the OTFT are formed of typical metal, and specific examples of the metal include, but are not limited to, gold (Au), silver (Ag), aluminum (Al), nickel (Ni), or indium tin oxide (ITO).

Examples of material for the substrate of the OTFT include, but are not limited to, glass, polyethylene naphthalate (PEN), polyethylene terephthalate (PET), polycarbonate, polyvinylalcohol, polyacrylate, polyimide, polynorbornene, or polyethersulfone (PES).

The alternating copolymer of phenylene vinylene and biarylene vinylene according to the example embodiments may also be applied to various electronic devices, in addition to the OTFT. Examples of the electronic device include, but are not limited to, an organic light emitting device (OLED), an organic photovoltaic device, or a sensor.

Hereinafter, example embodiments will be described in detail with reference to Examples. These Examples are set forth to illustrate example embodiments, but should not be construed to be the limit of example embodiments.

EXAMPLES

Synthesis of Alternating Copolymers of Phenylene Vinylene and Biarylene Vinylene Alternating copolymers (PPVBTV-1 to PPVBTV-9) of phenylene vinylene and biarylene vinylene were synthesized through the reaction according to Scheme 2 below.

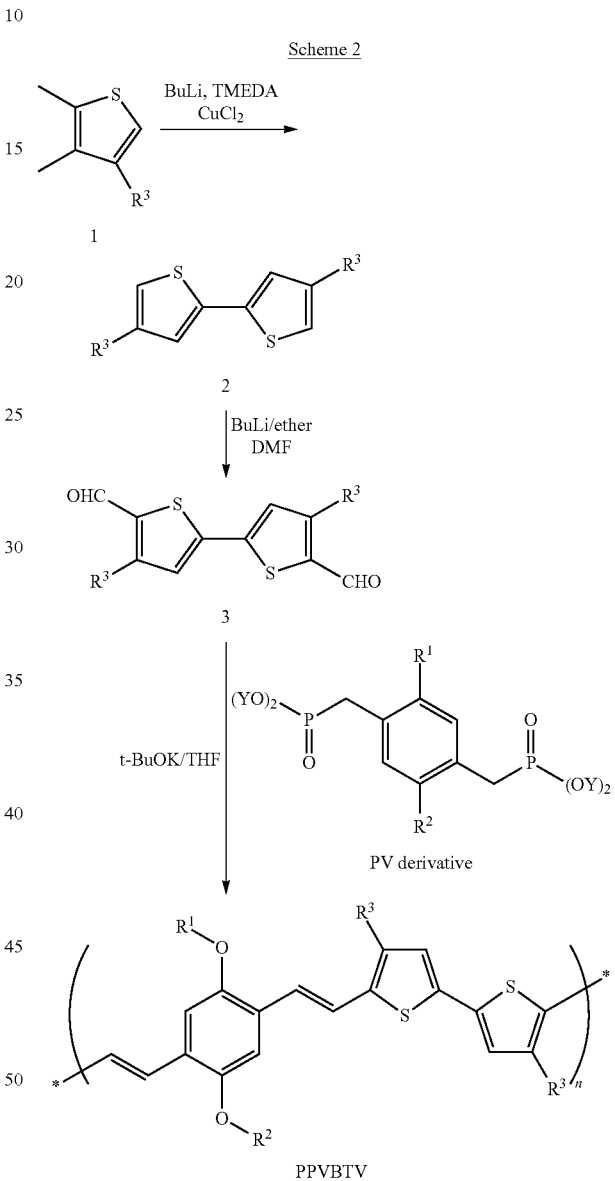

Preparative Example 1

Synthesis of Alternating Copolymer (PPVBTV-1) of Phenylene Vinylene (PV) Derivative and Bithiophene Vinylene (BTV) Derivative Into a flask containing 50 ml of anhydrous tetrahydrofuran (THF), tetramethyl-ethylenediamine (16 mmol) and butyl lithium (16 mmol) were added, and then stirred for 30 min. Further, the stirred mixture was added with 3-octylthiophene (15 mmol), stirred at room temperature for 10 min, and then heated under reflux for 2 hours. The reaction mixture was cooled to room temperature and then to −78° C. using acetone-dry ice. The reaction mixture was added with copper chloride (19 mmol) and then stirred while the temperature thereof was gradually increased to room temperature. The reaction mixture was filtered with a Celite pad, concentrated, and passed through a silica gel column, thus obtaining a compound 2 separated in the form of a yellow solid (yield: 80%). The $^1$H NMR results of the compound 2 were as follows:

$^1$H NMR (CDCl$_3$) d 7.0 (s, 2H), 6.8 (s, 2H), 2.6 (t, 4H), 1.7 (m, 4H), 1.3 (m, 20H), 0.9 (t, 6H).

The compound 2 (4.9 mmol) was dissolved in 50 ml of anhydrous ether and then added with butyl lithium (11.2 mmol) in a nitrogen atmosphere. The reaction mixture was heated under reflux for 2 hours and then cooled to room temperature. Subsequently, to the reaction mixture, dimethylformamide (10.7 mmol) was added in droplets, followed by conducting stirring for 18 hours. Thereafter, the reaction mixture was added with a saturated ammonium chloride aqueous solution, and then extracted two times with ether. The collected organic layer was dried and concentrated under reduced pressure, thus obtaining a red solid. The solid was dissolved in ether and then cooled to −78° C., thus obtaining an organic solid, which was then filtered, thereby obtaining a compound 3 (yield: 75%). The $^1$H NMR results of the compound 3 were as follows.

$^1$H NMR (CDCl$_3$) d 10.0 (s, 2H), 7.2 (s, 2H), 2.9 (t, 4H), 1.7 (m, 4H), 1.3 (m, 20H), 0.9 (t, 6H).

Figure 2:
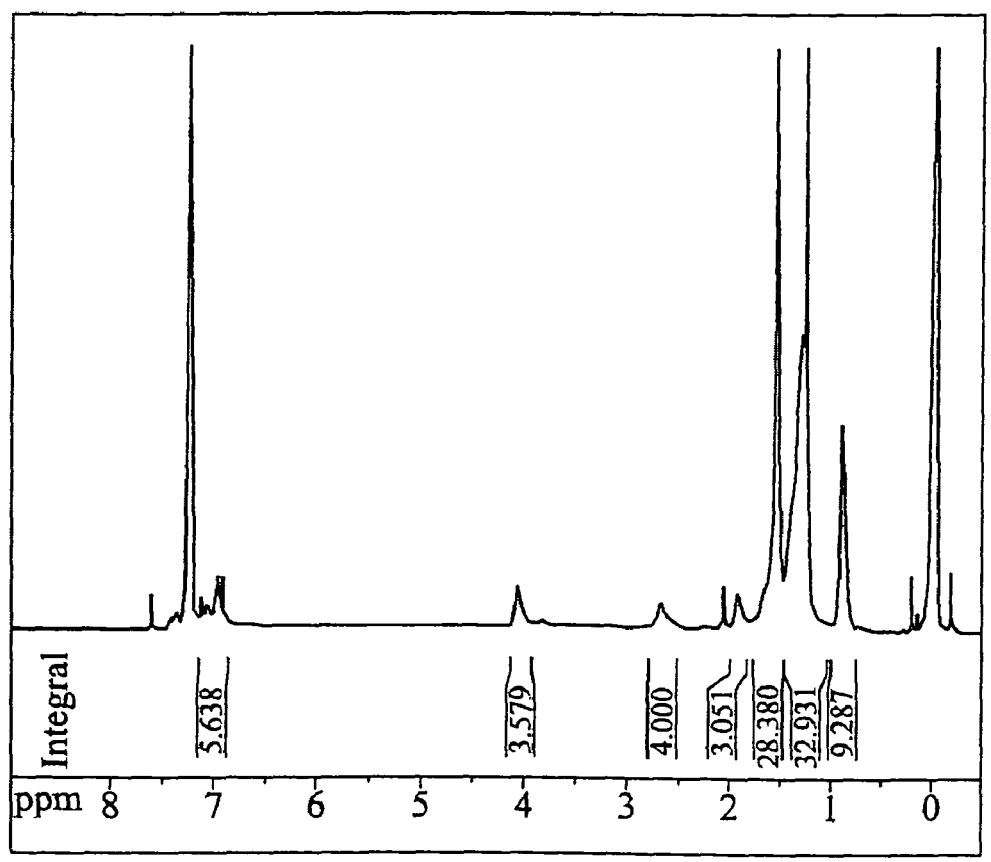
FIG. 2 is a $^1$H-NMR spectrum of an alternating copolymer (PPVBTV-1) of a phenylene vinylene (PV) derivative and a bithiophene vinylene (BTV) derivative, obtained in Preparative Example 1.

In a flask, a phenylene vinylene (PV) derivative (in Formula 4, R$^1$, R$^2$=—OC$_8$H$_{17}$, 1 mmol) and the compound 3 (1 mmol) were dissolved in THF (2 ml) and then heated to about 80° C. The reaction mixture was slowly added with a solution of t-BuOK (3 mmol) in THF. The reaction was conducted for 12 hours, after which the reaction product was re-precipitated in methanol, thus recovering a high-molecular-weight material, which was then dried, thereby obtaining PPVBTV-1 of Formula 3 (yield: 45%, Mn=18,000). The $^1$H-NMR spectrum of the PPVBTV-1 is shown in FIG. 2.

Preparative Example 2

Synthesis of Alternating Copolymer (PPVBTV-2) of Phenylene Vinylene (PV) Derivative and Bithiophene Vinylene (BTV) Derivative An alternating copolymer (PPVBTV-2 of Formula 3) was synthesized in the same manner as in Preparative Example 1, with the exception that a phenylene vinylene (PV) derivative (in Formula 4, R$^1$, R$^2$=Heptyl-Oxy) was used as a monomer. (Yield: 40%, Mn=14,000).

Preparative Example 3

Figure 3:
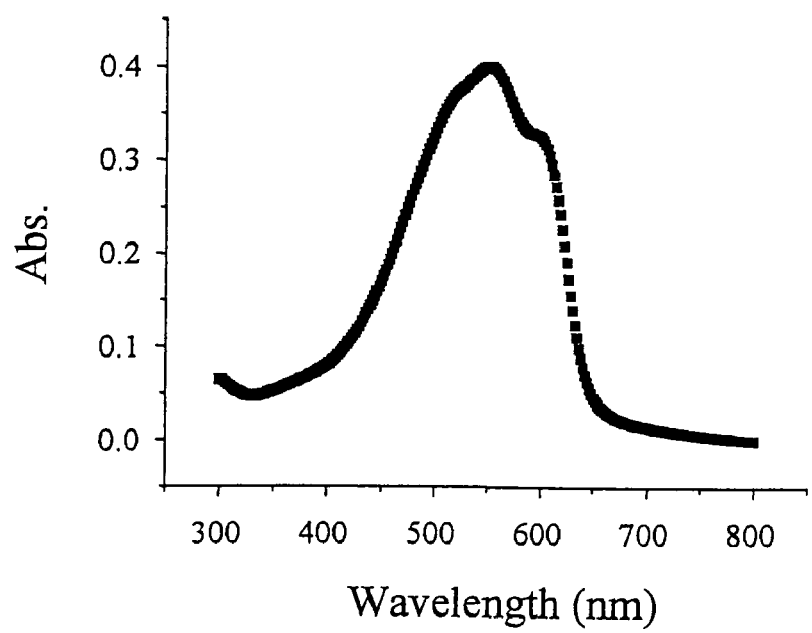
FIG. 3 is a UV-VIS spectrum of a film of an alternating copolymer (PPVBTV-3) of a phenylene vinylene (PV) derivative and a bithiophene vinylene (BTV) derivative, obtained in Preparative Example 3.

Synthesis of Alternating Copolymer (PPVBTV-3) of Phenylene Vinylene (PV) Derivative and Bithiophene Vinylene (BTV) Derivative An alternating copolymer (PPVBTV-3 of Formula 3) was synthesized in the same manner as in Preparative Example 1, with the exception that a phenylene vinylene (PV) derivative (in Formula 4, R$^1$, R$^2$=Hexyl-Oxy) was used as a monomer. (Yield: 40%, Mn=16,000). The UV-VIS spectrum of a film of the PPVBTV-3 is shown in FIG. 3.

Preparative Example 4

Synthesis of Alternating Copolymer (PPVBTV-4) of Phenylene Vinylene (PV) Derivative and Bithiophene Vinylene (BTV) Derivative An alternating copolymer (PPVBTV-4 of Formula 3) was synthesized in the same manner as in Preparative Example 1, with the exception that 3-hexylthiophene was used as a starting material. (Yield: 45%, Mn=16,000).

Preparative Example 5

Synthesis of Alternating Copolymer (PPVBTV-5) of Phenylene Vinylene (PV) Derivative and Bithiophene Vinylene (BTV) Derivative An alternating copolymer (PPVBTV-5 of Formula 3) was synthesized in the same manner as in Preparative Example 2, with the exception that 3-hexylthiophene was used as a starting material. (Yield: 40%, Mn=19,000).

Preparative Example 6

Synthesis of Alternating Copolymer (PPVBTV-6) of Phenylene Vinylene (PV) Derivative and Bithiophene Vinylene (BTV) Derivative An alternating copolymer (PPVBTV-6 of Formula 3) was synthesized in the same manner as in Preparative Example 3, with the exception that 3-hexylthiophene was used as a starting material. (Yield: 40%, Mn=18,000).

Preparative Example 7

Synthesis of Alternating Copolymer (PPVBTV-7) of Phenylene Vinylene (PV) Derivative and Bithiophene Vinylene (BTV) Derivative An alternating copolymer (PPVBTV-7 of Formula 3) was synthesized in the same manner as in Preparative Example 1, with the exception that 3-butylthiophene was used as a starting material. (Yield: 40%, Mn=12,000).

Preparative Example 8

Synthesis of Alternating Copolymer (PPVBTV-8) of Phenylene Vinylene (PV) Derivative and Bithiophene Vinylene (BTV) Derivative An alternating copolymer (PPVBTV-8 of Formula 3) was synthesized in the same manner as in Preparative Example 2, with the exception that 3-butylthiophene was used as a starting material. (Yield: 40%, Mn=12,000).

Preparative Example 9

Synthesis of Alternating Copolymer (PPVBTV-9) of Phenylene Vinylene (PV) Derivative and Bithiophene Vinylene (BTV) Derivative An alternating copolymer (PPVBTV-9 of Formula 3) was synthesized in the same manner as in Preparative Example 3, with the exception that 3-butylthiophene was used as a starting material. (Yield: 40%, Mn=11,000).

Fabrication of OTFT

Example 1

Fabrication of OTFT Using PPVBTV-1

On a washed glass substrate, chromium for a gate electrode was deposited to a thickness of 1000 Å through sputtering, after which SiO$_2$ for a gate insulating film was deposited to a thickness of 1000 Å through CVD. Subsequently, ITO for source/drain electrodes was deposited thereon to a thickness of 1200 Å through sputtering. Before the organic semiconductor material was deposited, the substrate was washed with isopropyl alcohol for 10 min and was then dried. Subsequently, the substrate having ITO deposited thereon was immersed in a 10 mM octadecyltrichlorosilane solution in chloroform for 30 sec, washed with acetone, and then dried. Subsequently, the alternating copolymer (PPVBTV-1) of phenylene vinylene (PV) and biarylene vinylene (BTV), synthesized in Preparative Example 1, was dissolved to a concentration of 1 wt % in chloroform, applied on the substrate to a thickness of 1000 Å at 1000 rpm, and then baked at 100° C. for 1 hour in an argon atmosphere, thereby fabricating the OTFT.

Examples 2 to 9

Fabrication of OTFTs Using PPVBTVs

OTFTs were fabricated in the same manner as in Example 1, with the exception that the types of alternating copolymer of phenylene vinylene and biarylene vinylene were changed as shown in Table 1 below.

The properties of the OTFTs were measured. The results are shown in Table 1 below.

Evaluation of Properties of OTFTs

Figure 4:
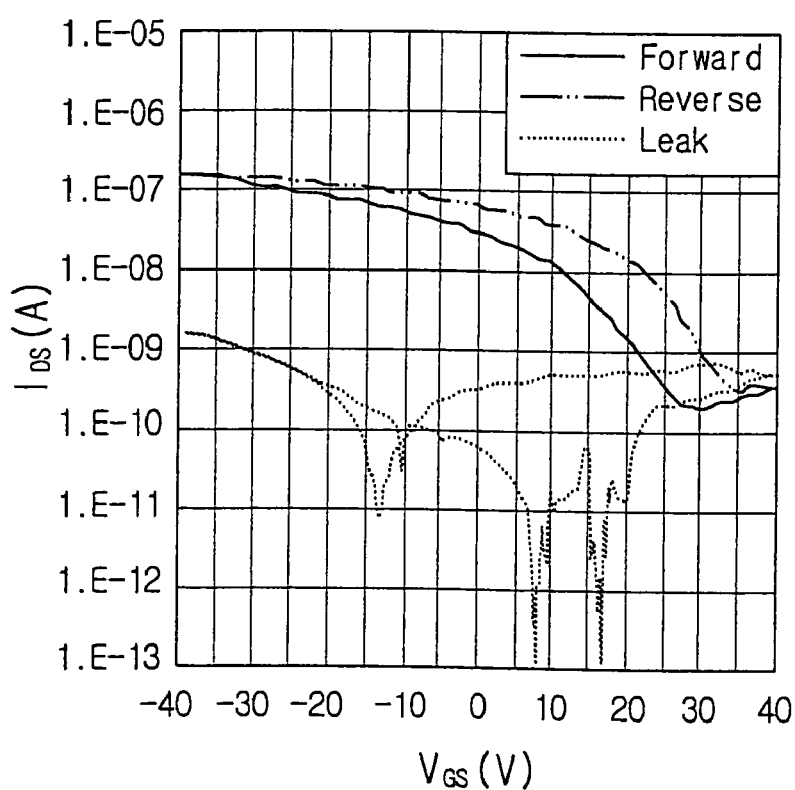
FIG. 4 is a current transfer curve of the alternating copolymer (PPVBTV-3) of a phenylene vinylene (PV) derivative and a bithiophene vinylene (BTV) derivative, obtained in Preparative Example 3.
Figure 5:
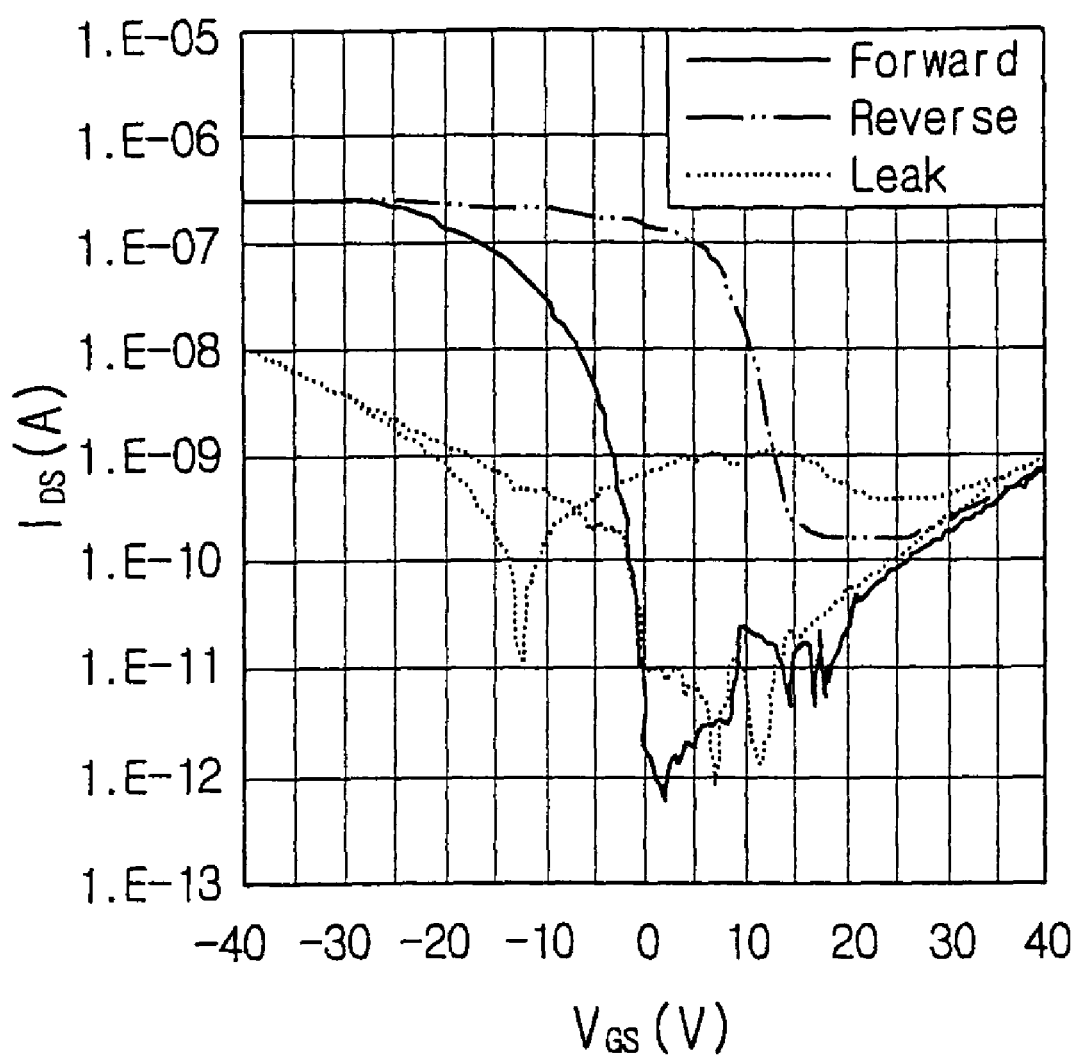
FIG. 5 is a current transfer curve of the alternating copolymer (PPVBTV-7) of a phenylene vinylene (PV) derivative and a bithiophene vinylene (BTV) derivative, obtained in Preparative Example 7.

The current transfer properties of the OTFTs fabricated in Examples 1 to 9 were measured using a semiconductor characterization system (4200-SCS), available from KEITHLEY. The current transfer curve of PPVBTV-3 is shown in FIG. 4, and the current transfer curve of PPVBTV-7 is shown in FIG. 5. Further, the electrical properties based on the current transfer properties were calculated as follows. The results are also shown in Table 1 below.

TABLE 1

| Type of PPVBTV | Charge Mobility (cm$^2$) | On-Off Current Ratio | Off-State Leakage Current (A) |
|---|---|---|---|
| Ex. 1 PPVBTV-1 | 0.001 | 1000 | 3 × 10$^{-11}$ |
| Ex. 2 PPVBTV-2 | 0.003 | 7000 | 7 × 10$^{-11}$ |
| Ex. 3 PPVBTV-3 | 0.012 | 1000 | 1 × 10$^{-10}$ |
| Ex. 4 PPVBTV-4 | 0.00002 | 100 | 1 × 10$^{-10}$ |
| Ex. 5 PPVBTV-5 | 0.00088 | 1000 | 1 × 10$^{-10}$ |
| Ex. 6 PPVBTV-6 | 0.0005 | 500 | 1 × 10$^{-10}$ |
| Ex. 7 PPVBTV-7 | 0.03 | 300000 | 2 × 10$^{-10}$ |
| Ex. 8 PPVBTV-8 | 0.002 | 5000 | 1 × 10$^{-10}$ |
| Ex. 9 PPVBTV-9 | 0.001 | 100 | 1 × 10$^{-10}$ |

The charge mobility was calculated from the following current equation for the saturation region. That is, the current equation for the saturation region was converted into a graph relating $(I_{SD})^{1/2}$ and $V_G$, and the charge mobility was calculated from the slope of the converted graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FBT} = (\text{slope})^2 \frac{2L}{C_0 W}$$

wherein $I_{SD}$ is the source-drain current, $\mu$ or $\mu_{FET}$ is the charge mobility, $C_o$ is the oxide film capacitance, W is the channel width, L is the channel length, $V_G$ is the gate voltage, and $V_T$ is the threshold voltage.

The off-state leakage current ($I_{off}$), which is the current flowing in the off-state, was taken from the minimum current in the off-state of the on/off current ratio.

The on/off current ratio ($I_{on}/I_{off}$) was taken from the ratio of maximum current in the on-state to minimum current in the off-state.

As is apparent from Table 1, the OTFTs of Examples 1 to 9 using the alternating copolymers of phenylene vinylene and biarylene vinylene could be seen to realize considerably low off-state leakage current and a high on/off current ratio.

As described hereinbefore, the alternating copolymer of phenylene vinylene and biarylene vinylene according to the example embodiments is a novel p-type polymer organic semiconductor. In the case where such an alternating copolymer is used for an organic active layer of an OTFT, the electrical properties of the OTFT can be improved. For example, the OTFT using the alternating copolymer of phenylene vinylene and biarylene vinylene according to the example embodiments can manifest low leakage current, high charge mobility, and superior stability.

Although example embodiments have been disclosed for illustrative purposes, those skilled in the art will appreciate that various modifications, additions and substitutions are possible, without departing from the scope and spirit of the invention as disclosed in the accompanying claims.

What is claimed is:

1. An organic thin film transistor, comprising a substrate, a gate electrode, a gate insulating layer, an organic active layer, and source/drain electrodes, wherein the organic active layer is formed of an alternating copolymer of phenylene vinylene and biarylene vinylene, represented by Formula 1 below:

Formula 1

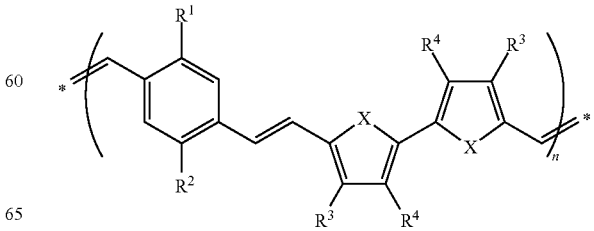

wherein $R^1$, $R^2$, $R^3$, and $R^4$ are each independently selected from a group consisting of hydrogen, a hydroxyl group, a $C_{1\sim20}$ linear, branched or cyclic alkyl group, a $C_{1\sim20}$ alkoxyalkyl group, and a $C_{1\sim16}$ linear, branched or cyclic alkoxy group, X is selected from a group consisting of S, O, NH, N-methyl, and Se, and n is an integer from 4 to 200.

2. The organic thin film transistor of claim 1, wherein the alternating copolymer of phenylene vinylene and biarylene vinylene comprises a compound selected from a compound group represented by Formula 2 below:

Formula 2

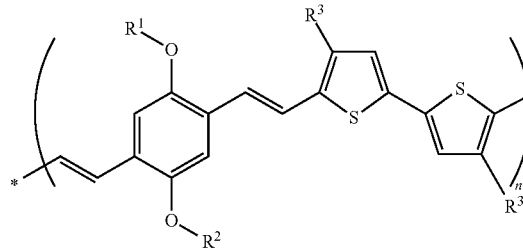

wherein $R^1$ and $R^2$ are each independently selected from a group consisting of a hexyl group, a heptyl group, and an octyl group, $R^3$ is selected from a group consisting of a butyl group, a hexyl group, and an octyl group, and n is an integer from 4 to 200.

3. The organic thin film transistor of claim 1, wherein the alternating copolymer of phenylene vinylene and biarylene vinylene comprises a compound selected from a compound group represented by Formula 3 below:

Formula 3

PPVBTV-1

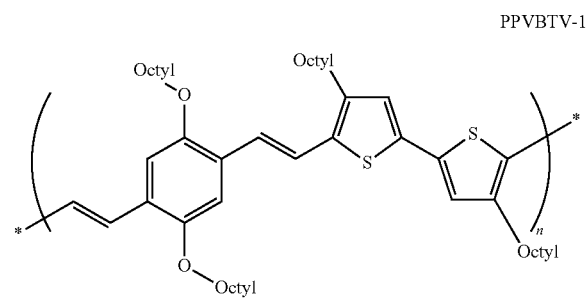

PPVBTV-2

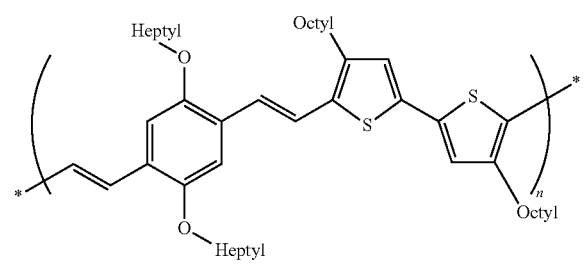

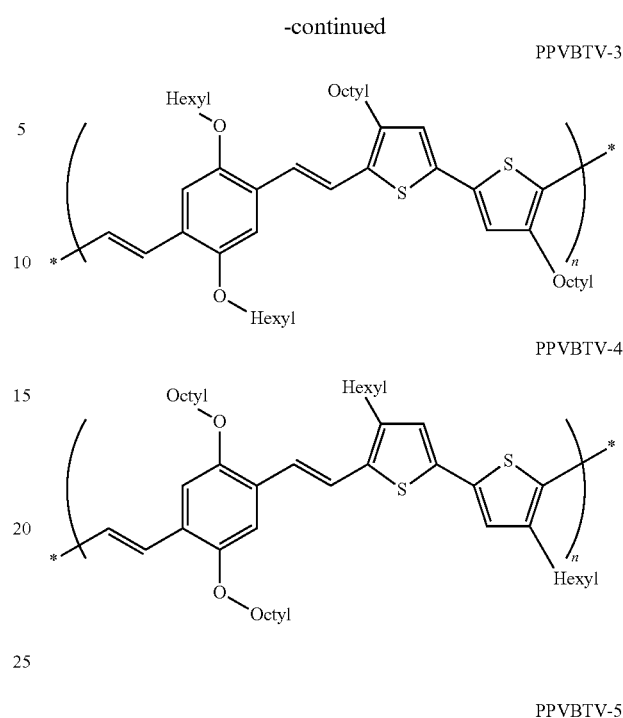

PPVBTV-8

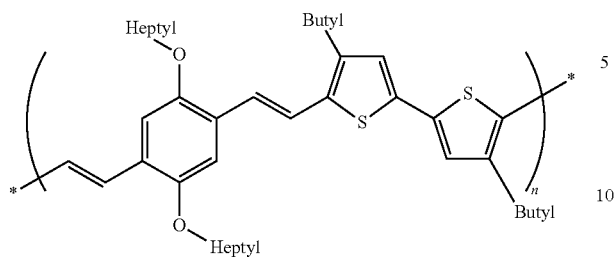

PPVBTV-9

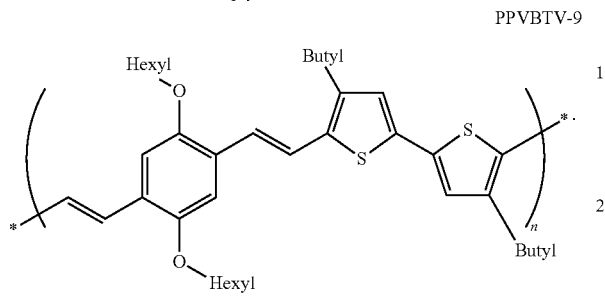

4. An electronic device, comprising an alternating copolymer of phenylene vinylene and biarylene vinylene, represented by Formula 1 below:

Formula 1

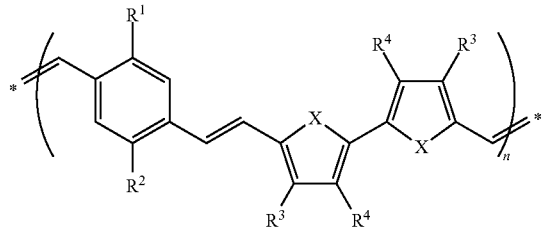

wherein $R^1$, $R^2$, $R^3$, and $R^4$ are each independently selected from a group consisting of hydrogen, a hydroxyl group, a $C_{1\sim20}$ linear, branched or cyclic alkyl group, a $C_{1\sim20}$ alkoxyalkyl group, and a $C_{1\sim16}$ linear, branched or cyclic alkoxy group, X is selected from a group consisting of S, O, NH, N-methyl, and Se, and n is an integer from 4 to 200.

5. The electronic device of claim 4, wherein the electronic device is at least one of an organic photovoltaic device and a sensor.

* * * * *